(12) United States Patent
Graf et al.

(10) Patent No.: US 8,953,294 B2
(45) Date of Patent: Feb. 10, 2015

(54) CIRCUIT ARRANGEMENT WITH AN OVERCURRENT FUSE

(75) Inventors: Alfons Graf, Kaufering (DE); Christian Arndt, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1517 days.

(21) Appl. No.: 12/326,590

(22) Filed: Dec. 2, 2008

(65) Prior Publication Data

US 2009/0147420 A1    Jun. 11, 2009

(30) Foreign Application Priority Data

Dec. 6, 2007    (DE) .......................... 10 2007 058 740

(51) Int. Cl.
| | | |
|---|---|---|
| *H02H 3/08* | (2006.01) | |
| *H02H 9/02* | (2006.01) | |
| *H03K 17/082* | (2006.01) | |
| *H02H 3/00* | (2006.01) | |
| *H02H 7/00* | (2006.01) | |
| *H02H 9/08* | (2006.01) | |
| *H02H 3/22* | (2006.01) | |
| *H03K 17/08* | (2006.01) | |

(52) U.S. Cl.
CPC .... *H03K 17/0822* (2013.01); *H03K 2017/0806* (2013.01)
USPC .................. 361/93.1; 361/2; 361/111; 361/42

(58) Field of Classification Search
CPC .................................................. H03K 17/0822
USPC ......................................................... 361/93.1
See application file for complete search history.

(56) References Cited

U.S. PATENT DOCUMENTS

| | | | | |
|---|---|---|---|---|
| 4,979,068 A * | 12/1990 | Sobhani et al. | .................. | 361/18 |
| 5,045,924 A | 9/1991 | Ikegame | | |
| 6,204,648 B1 * | 3/2001 | Saeki et al. | .................... | 323/282 |
| 6,600,641 B2 * | 7/2003 | Oglesbee et al. | ............. | 361/103 |
| 6,922,322 B2 * | 7/2005 | Strayer et al. | .................. | 361/111 |
| 7,538,519 B2 * | 5/2009 | Daou et al. | ..................... | 320/134 |

FOREIGN PATENT DOCUMENTS

| | | |
|---|---|---|
| DE | 40 20 343 A1 | 1/1992 |
| DE | 100 04 871 A1 | 8/2001 |
| WO | WO 96/33078 | 10/1996 |

* cited by examiner

Primary Examiner — Jared Fureman
Assistant Examiner — Lucy Thomas
(74) Attorney, Agent, or Firm — Slater & Matsil, L.L.P.

(57) ABSTRACT

A circuit arrangement includes a semiconductor switch having a control terminal and a load path. A drive circuit is coupled to the control terminal of the semiconductor switch. The drive circuit has a current measuring arrangement for determining a load current flowing through the load path and is designed to prevent the semiconductor switch from being driven in the off state if the load current exceeds a predetermined load current threshold value. A fuse is coupled in series with the load path of the semiconductor switch triggers if a triggering condition dependent at least on the load current is present.

23 Claims, 7 Drawing Sheets

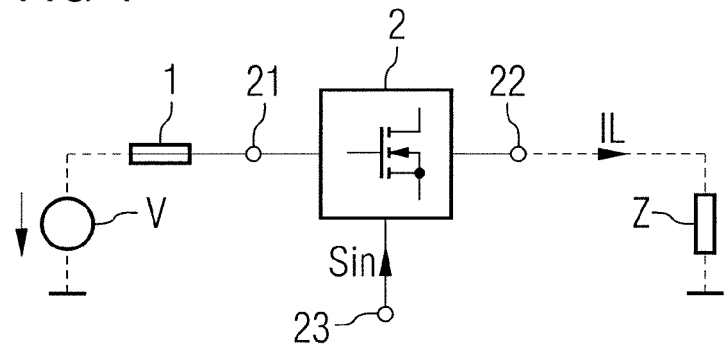
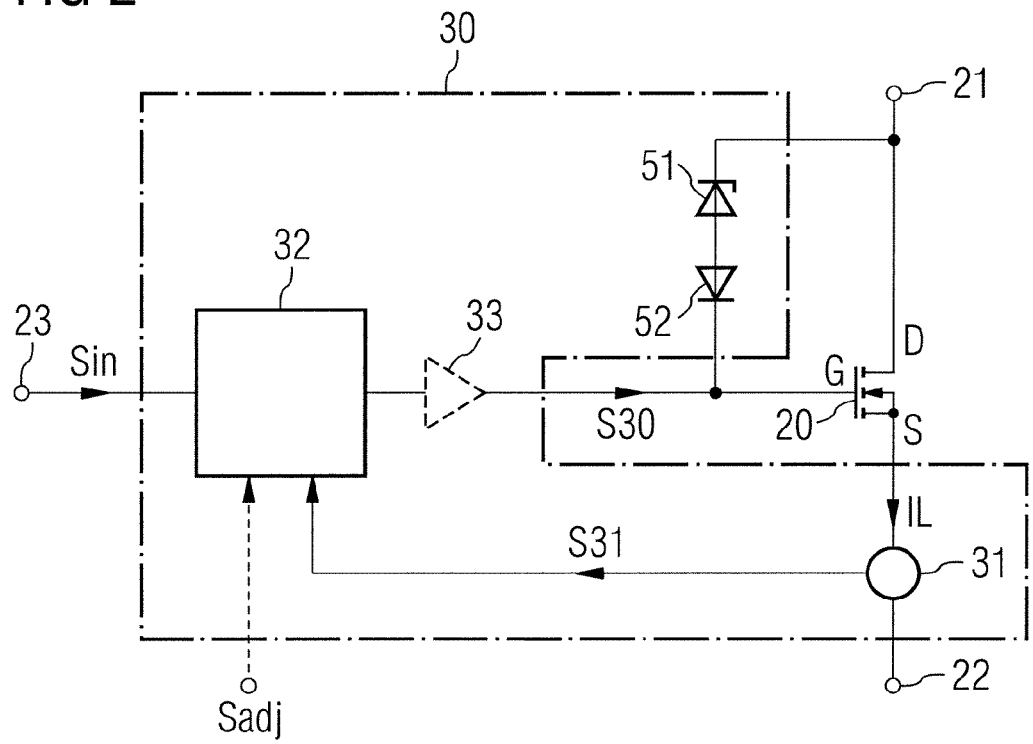

CIRCUIT ARRANGEMENT WITH AN OVERCURRENT FUSE

This application claims priority to German Patent Application 10 2007 058 740.8, which was filed Dec. 6, 2007 and is incorporated herein by reference.

TECHNICAL FIELD

The present invention relates to a circuit arrangement with an overcurrent fuse.

BACKGROUND

In order to protect an electrical load against an overload caused by an excessively high current, a fusible link can be connected in series with the load. Such a fuse triggers in accordance with a design-predetermined triggering characteristic curve if a current taken up by the load exceeds a predetermined limit value. Such a fuse also protects a voltage supply arrangement of the load against an overload if a short circuit occurs in the load. There are fuses in various fuse classes that differ with regard to the triggering criteria, i.e., the triggering current and the triggering delay. However due to manufacturing, fusible links are subject to considerable variations with regard to the triggering criteria, such that fuses of the same class can differ significantly with regard to the triggering current and the triggering delay.

Power transistors, such as, e.g., power MOSFETs, can be used as switches for electrical loads. So-called Smart-FETs, in particular, are suitable as switches for this purpose. Smart-FETs, such as, for example, PROFETs® from Infineon Technologies AG, Munich, are power MOSFETs having additional protection functions. One of these protection functions is an overload protection, which turns off the MOSFET if the load current thereof, for example due to a short circuit of a connected load, reaches a predetermined limit value. Another of the protection functions is an overvoltage protection, which activates the MOSFET if the drain-source voltage thereof reaches a predetermined limit value, in order to prevent a further voltage rise and to protect the component against damage. If the MOSFET is turned off owing to an overcurrent, then the overvoltage protection makes it possible to convert the electrical energy stored in inductive loads into heat. This energy is proportional to the product of the square of the load current that flowed last and the total inductance of the load ($E = L \cdot I^2$).

What is problematic in this context is that, due to an advancing increase in the integration density, power MOSFETs with a given blocking voltage capability and given ampacity are becoming smaller and smaller, that is to say that the volume of a semiconductor chip in which the MOSFET is integrated and which takes up the waste heat is becoming smaller and smaller. With an advancing increase in the integration density, therefore, a given electrical energy to be converted into heat leads to a greater heating of the semiconductor chip. In this case, consideration should be given to the fact that a technology-dictated maximum temperature must not be exceeded, in order to avoid damage to the component.

SUMMARY OF THE INVENTION

A circuit arrangement in accordance with one exemplary embodiment includes a switching arrangement with a semiconductor switch having a control terminal and a load path, and with a drive circuit coupled to the control terminal of the semiconductor switch, the drive circuit having a current measuring arrangement for determining a load current flowing through the load path, and being designed to prevent the semiconductor switch from being driven in the off state if the load current exceeds a predetermined load current threshold value. In the case of this circuit arrangement, a fuse is connected in series with the load path of the semiconductor switch of the switching arrangement, the fuse triggers if a triggering condition dependent at least on the load current is present.

In the case of this circuit arrangement, the semiconductor switch of the switching arrangement is protected against destruction that could occur on account of high energy to be converted into heat during a turn-off process, by virtue of the fact that the semiconductor switch is prevented from being turned off at those currents which lie above the load current threshold value. Protection of a connected load or of a voltage supply is then undertaken by the fuse, which triggers if the current does not decrease again within the triggering delay of the fuse.

BRIEF DESCRIPTION OF THE DRAWINGS

Examples are explained in more detail below with reference to the figures. The figures serve for elucidating the basic principle of the invention and only show the circuit components necessary for understanding the invention. In this case, identical reference symbols designate identical circuit components with the same meaning.

FIG. 1 shows a circuit arrangement for switching a load which comprises a series circuit comprising a fuse and a switching arrangement;

FIG. 2 shows an example of the switching arrangement having a semiconductor switch and a drive circuit for the semiconductor switch;

FIG. 3, illustrates the functioning of the circuit arrangement with the fuse and the switching arrangement on the basis of a load current characteristic curve and on the basis of a drive signal of the semiconductor switch of the switching arrangement;

DETAILED DESCRIPTION OF ILLUSTRATIVE EMBODIMENTS

Figure 3A:
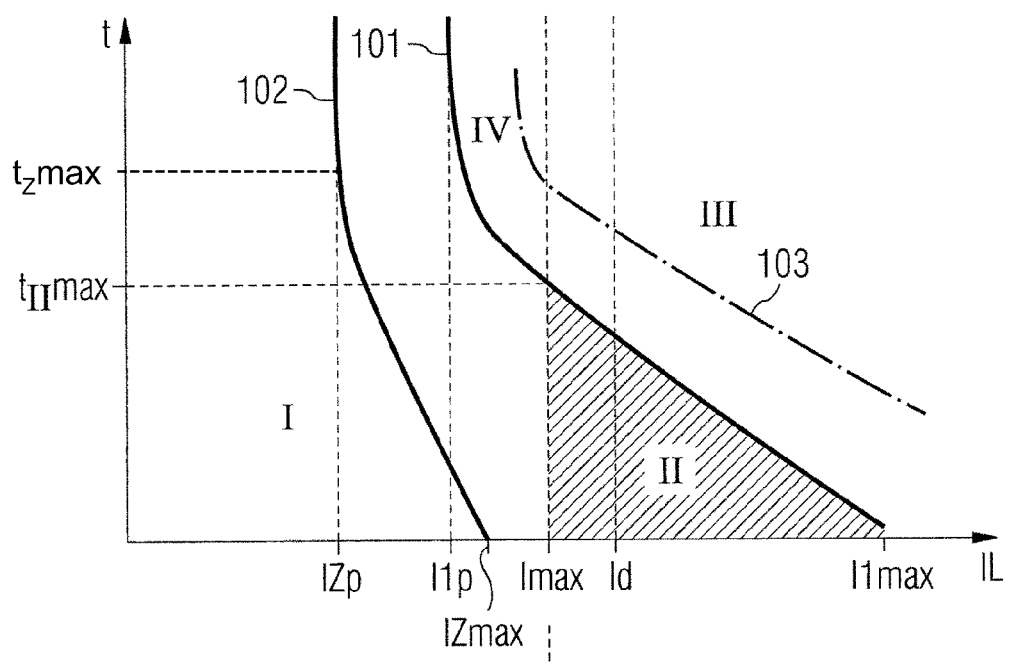
FIGS. 3a and 3b, collectively

FIG. 1 shows as an overview an exemplary embodiment of a circuit arrangement according to the invention for switching a load. The circuit arrangement comprises a switching arrangement 2 with load path terminal 21, 22 and a control terminal 23, and a fuse 1 which is connected in series with the load path terminals 21, 22 of the switching arrangement 2. The fuse 1 is a fusible link, for example, and is connected to the first load path terminal 21 of the switching arrangement 2 in the example illustrated. It goes without saying, however, that the fuse 1 could also be connected to the second load path terminal 22 of the switching arrangement 2.

In order to elucidate the functioning of the circuit arrangement comprising the fuse 1 and the switching arrangement 2, FIG. 1 shows an exemplary application of this circuit arrangement. In this case, the circuit arrangement is connected between a voltage source V and a load Z and serves for switching the load Z in accordance with a switching signal Sin, which is fed to the drive input 23 of the switching arrangement 2. Depending on the switching signal 23, the switching arrangement 2 opens or closes the electric circuit between the voltage source V and the load Z. The circuit arrangement 1, 2 illustrated can be used, for example, for switching electrical loads in motor vehicles. The voltage source V is then the vehicle battery, for example. The load Z can be any electrical load used in motor vehicles, such as, for example, an electric motor or a lighting device. The load can also be a complex circuit arrangement, such as, for example, a circuit comprising a control unit for driving load switches, the load switches driven by the control unit, and the loads switched by the load switches.

Referring to FIG. 2, the switching arrangement 2 has a semiconductor switch 20 having a load path, which is connected between the load path terminals 21, 22 of the switching arrangement 2, and a control terminal. The semiconductor switch illustrated in FIG. 2 is embodied as a MOS transistor, specifically as a MOSFET, having a drain-source path, which is formed between a drain connection D and a source connection S and which represents a load path, and having a gate connection G, which forms a control terminal. The drive circuit 30 has a drive logic 32, to which the switching signal Sin is fed and which provides a drive signal S30 for the semiconductor switch 20 depending on the switching signal, the drive signal being fed to the control terminal G of the semiconductor switch 20. A driver circuit 33 can optionally be provided between the drive logic 32 and the drive connection G of the semiconductor switch 20, the driver circuit being designed to convert signal levels of the logic signals available at the output of the drive logic 32 to signal levels suitable for driving the semiconductor switch 20. The driver circuit 33 can be realized in a manner known in principle and, comprise, for example, a charge pump circuit (not illustrated).

Instead of the MOSFET illustrated in FIG. 2, an IGBT or a bipolar transistor could also be used in a corresponding manner as a semiconductor switch.

If the semiconductor switch 20 illustrated in FIG. 2 is driven in the on state and if the fuse (1 in FIG. 1) is intact, then the electric circuit between the voltage source V and the load Z is closed and the load Z is thereby switched on. If the semiconductor switch 20 is turned off, then the electric circuit between the voltage source V and the load Z is open, whereby the load Z is switched off.

When driving inductive loads, with the semiconductor switch 20 driven in the on state, the load takes up energy for which the following holds true $$E\text{coil}=0.5 \cdot L \cdot IL^2 \tag{1}.$$

In this case, Ecoil denotes the energy taken up by the inductive load, L denotes the inductance of the inductive load, and IL denotes the load current flowing through the semiconductor switch 20 at the turn-off instant. In this case, the inductance L can be driven by the load itself and/or by the inductance of leads in the electric circuit comprising the load Z, the voltage source V and the circuit arrangement 1, 2. Particularly in the case of long leads, the influence of the inductance of the lines on the total inductance, that is to say the inductance formed by the lines and the load, can be considerable.

If the semiconductor switch 20 is turned off after an instant of being driven in the on state in which the load has taken up energy, then energy is converted into heat in the semiconductor switch 20. This energy which is converted into heat in the event of turn-off, and which is also referred to as turn-off energy hereinafter, is dependent on the energy previously stored in the load, such that the following holds true:

$$E\text{off}=f(E\text{coil}) \tag{2},$$

where f(·) describes the fundamentally known dependence of the turn-off energy on the energy previously stored in the coil. The turn-off energy Eoff is additionally dependent on the supply voltage, and rises as the supply voltage increases. The turn-off energy is additionally influenced by the energy which is converted into heat in parasitic resistances connected in series with the inductance. The higher this energy, the lower the turn-off energy converted into heat in the semiconductor switch.

In order to avoid destruction of the semiconductor switch 20 by overvoltages upon the commutation of an inductive load after the semiconductor switch 20 has been driven in the off state, the drive circuit 30 can have a voltage limiting arrangement, which drives the semiconductor switch 20 in the on state if a voltage across the load path thereof exceeds a predetermined threshold value. Such a voltage limiting arrangement can be, for example, a basic known active zener circuit 51, 52 having a zener diode and a further diode, which is connected between the drain connection D and the gate connection G. If the electrical potential at the drain connection D in this case exceeds the electrical potential at the gate connection G by the value of the breakdown voltage of the zener diode 51, then the transistor 20 is driven in the on state. The voltage across the load path at which the semiconductor switch 20 is driven in the on state is significantly higher than the voltage present across the load path of the semiconductor switch 20 in a switched-on state. In "over voltage protection operations", the transistor used as semiconductor switch 20 is thereby operated with a significantly higher on resistance, such that the electrical energy previously stored in the electric circuit is converted into heat in an effective manner in the transistor 20.

Instead of an active zener circuit, any further voltage limiting arrangements which protect the semiconductor switch 20 against destruction by overvoltages can be provided, of course. If a so-called "avalanche-resistant" semiconductor switch is used as semiconductor switch 20, then such a voltage limiting circuit can be dispensed with. Such a semiconductor switch can be operated nondestructively in an avalanche operation. The avalanche operation commences when a load path voltage of the semiconductor switch rises above the value of an avalanche breakdown voltage. Such a semiconductor switch is directly able to accept the commutation current of an inductive load in an avalanche operation.

The transistor 20 and the drive circuit 30 can be realized as a common integrated circuit in a semiconductor chip. However, the transistor 20 and the drive circuit 30 can also be realized in separate semiconductor chips which can be arranged one above another using chip-on-chip technology or alongside one another using chip-by-chip technology and be accommodated in a common chip housing.

The advancing reduction of the feature sizes of integrated circuits is accompanied by a reduction in the volume of the semiconductor chips and hence the ability of the semiconductor chips to convert electrical energy into heat without critical temperatures that lead to destruction of the component being exceeded in the process. In order to avoid destruction of the switching arrangement 2 during those turn-off processes in which so much electrical energy is to be converted into heat in the transistor 20 that there is the risk of destruction, the drive circuit 30 is designed to detect the load current IL through the transistor 20 and to prevent the transistor 20 from being driven in the off state if the load current IL exceeds a predetermined current threshold value, which is also referred to hereinafter as maximum permissible turn-off current Imax. In the case of such load currents that exceed the current threshold value Imax, a fuse function is ensured by the fuse 1 connected in series with the switching arrangement 2.

The above-explained functioning of the circuit arrangement with the transistor 20 that can no longer be turned off at high load currents is explained below with reference to FIGS. 3a and 3b. For this purpose, FIG. 3a illustrates a triggering characteristic curve 101 of the fuse 1, which indicates the conditions under which the fuse triggers depending on the magnitude of the load current flowing and the duration of the load current respectively flowing. The triggering characteristic curve 101 thus represents the triggering current, that is to say the current at which the fuse triggers, depending on the triggering delay. In FIG. 3a, the triggering current is plotted toward the right and the triggering delay is plotted upward. In this case, the triggering delay increases as the triggering current decreases, or decreases as the triggering current increases. In FIG. 3a, I1$p$ in this case denotes a continuous loading current of the fuse, that is to say a current which the fuse can accept during continuous operation without triggering. In FIG. 3a, I1max denotes a maximum triggering current of the fuse 1, that is to say the current at which the fuse 1 triggers with a minimum delay time. This minimum delay time lies, for example, in the range of a few milliseconds. FIG. 3a also illustrates the maximum permissible turn-off current Imax, starting from which the transistor 20 remains permanently switched on.

Figure 3B:
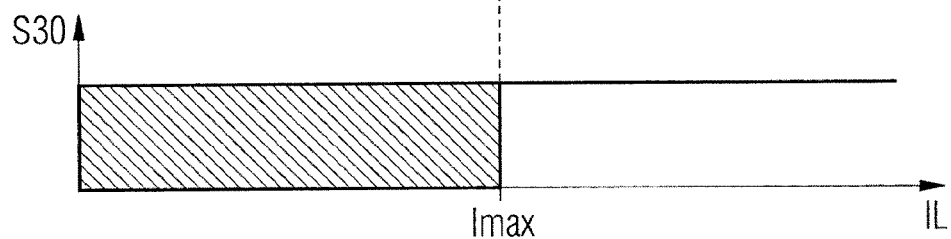

FIG. 3b shows the drive signal S30 of the transistor 20 as a function of the load current IL. For explanation purposes it is assumed here that the transistor 20 is driven in the on state at an upper signal level (high level) of the drive signal S30 and is driven in the off state at a lower signal level (low level) of the drive signal S30. For load currents IL smaller than the maximum permissible turn-off current Imax, the transistor 20 can be turned on and off as desired. For these "small load currents", the drive signals S30 can assume a switch-on level or a switch-off level as desired, which is illustrated in FIG. 3b by a patched representation of the drive signal S30 in this range. For load currents IL above the maximum permissible turn-off current Imax, the transistor 20 is prevented from being turned off, that is to say that the drive signal S30 assumes a high level for these load current values. If the load current IL therefore rises above the maximum permissible turn-off current Imax after the transistor 20 has been driven in the on state, then the drive signal S30 remains permanently at a switch-on level. The transistor 20 can then be turned off again only if the load current IL falls below the maximum permissible turn-off current Imax.

After the maximum permissible turn-off current is exceeded, the circuit arrangement comprising the fuse 1 and the switching arrangement 2 remains fully functional only if the load current IL falls below the maximum permissible turn-off current Imax again before the fuse actually triggers. Referring to FIG. 3a, the fuse 1 triggers for load current values IL above the maximum permissible turn-off current Imax at the latest after a delay time $T_{II}$max. This delay time is dependent on the slope of the triggering characteristic curve of the fuse 1 and dependent on the difference between the maximum permissible turn-off current Imax and the maximum triggering current I1max of the fuse 1. In this case, the maximum permissible turn-off current Imax is less than the maximum triggering current I1max of the fuse.

Different operating states of the circuit arrangement can be differentiated taking account of the maximum permissible turn-off current Imax and the triggering characteristic curve 101 of the fuse, the operating states being explained below with reference to FIG. 3a. In this case, in principle four operating states can be differentiated, each operating state of which is represented by one of four segments into which the triggering characteristic curve 101 of the fuse and the characteristic curve for the maximum permissible turn-off current Imax subdivide the diagram in FIG. 3a. In a first region I, the load currents IL are less than the maximum permissible turn-off current Imax and lie below the triggering characteristic curve 101 of the fuse 1, that is to say that they are either less than the continuous current I1$p$ of the fuse or lie between the continuous value I1$p$ and the maximum permissible turn-off current Imax, but then flow only for such a short time that the fuse 101 does not trigger. In this region, the transistor 20 can be turned on and off as desired. In a second region II, the load current IL lies above the maximum permissible turn-off current Imax, but the load currents only flow for such a short time that the fuse 1 does not trigger. The further regions III and IV lie on the other side of the triggering characteristic curve 101 of the fuse, that is to say characterize operating states which the circuit arrangement cannot assume. In this case, III denotes a region in which the load currents IL are greater than the maximum permissible turn-off current Imax and are present for longer than "permitted" by the triggering characteristic curve 103. IV denotes a region in which the load currents IL lie between the triggering characteristic curve 101 and the maximum permissible turn-off current Imax.

The circuit arrangement explained makes it possible to effect switching of the load (Z in FIG. 1) with at the same time protection of the load, the voltage supply V and the lines against overcurrents and protection of the switching arrangement 2 against destruction during turn-off processes. If, in this arrangement, the load current IL exceeds the maximum permissible turn-off current Imax of the transistor 20 only for a short time, that is to say for a time which is shorter than the triggering delay of the fuse 1 that is assigned to the respective load current, then the circuit arrangement remains fully functionally intact. During the short time duration during which the load current IL exceeds the maximum permissible turn-off current Imax, the transistor 20 is prevented from being turned off, whereby the transistor is protected against destruction. A turn-off is then possible again only if the load current IL falls below the maximum permissible turn-off current Imax. If the load current IL exceeds the maximum permissible turn-off current Imax for a time duration which is longer than the delay time of the fuse 1 that is assigned to the respective load current, then the fuse 1 triggers and thereafter prevents a current flow to the load. The switching arrangement with the semiconductor switch remains functional in this case. In order to reestablish full functionality of the circuit arrangement, it is merely necessary to replace the fuse. This is usually possible with a low technical complexity and a lower cost expenditure than replacing the switching arrangement.

In the example in accordance with FIG. 3a, the maximum permissible turn-off current Imax of the transistor 20 is chosen such that it lies between the continuous loading current I1p and the maximum permissible turn-off current I1max of the fuse. This ensures that there is no operating range in which the transistor 20 remains permanently switched on owing to the maximum permissible turn-off current being exceeded but the fuse does not trigger, even with a long delay time.

The maximum permissible turn-off current Imax is additionally chosen such that it is less than a component-specific destructive turn-off current Id that would bring about destruction of the transistor 20 during turn-off. This destructive turn-off current ID is likewise illustrated in FIG. 3a.

Furthermore, the fuse 1 should be adapted to the transistor 20 in such a way that the fuse characteristic curve 101 lies below a destruction characteristic curve 103 of the transistor 20. The destruction characteristic curve 103, which is likewise illustrated in FIG. 3a, illustrates that profile of the load current IL against time t in the case of which the transistor would be destroyed in the switched-on state, that is to say without a turn-off process being initiated. The profile of the destruction characteristic curve 103 corresponds qualitatively to the profile of the fuse characteristic curve, that is to say that for a short time high load currents IL can be accepted by the transistor 20 without the transistor being destroyed, whereas in continuous operation only lower load currents are tolerated without the transistor 20 being destroyed. The destruction characteristic curve 103 illustrated represents destruction states which are in each case characterized by a load current and a time duration for which the respective load current has to flow in order to destroy the transistor. In this case, the triggering characteristic curve 101 of the fuse is chosen in such a way that the fuse triggers before one of these destruction states represented by the destruction characteristic curve 103 can actually be attained.

FIG. 3a additionally illustrates by way of example a load characteristic curve 102 of the load (Z in FIG. 1), which represents maximum load states of the load and which therefore represents the "application limit" for the circuit arrangement explained. In the load characteristic curve 102, load currents which can flow maximally with the load functioning properly are plotted as a function of the respective time duration for which these currents can flow. In this case, IZp denotes a maximum continuous current that flows. Currents higher than the maximum continuous current IZp can also flow within a time window between zero and tzmax. Such higher currents are, for example, start-up currents in the case of a load realized as a motor. In FIG. 3a, IZmax denotes a maximum possible load current during properly functioning operation of the load. In this case, the triggering characteristic curve 101 of the fuse should be coordinated with the load characteristic curve 103 in such a way that triggering states of the fuse 1 are not attained during proper operation of the load. This is evident in FIG. 3a from the fact that the load characteristic curve 102 lies on the left or below the triggering characteristic curve 101 or is shifted toward lower load currents or, given the same load currents, toward shorter current flow durations relative to the triggering characteristic curve 101. In other words, the load currents represented by the load characteristic curve 102 are less than the triggering currents of the fuse or flow for a shorter time duration given the same currents as the triggering currents.

Figure 8:
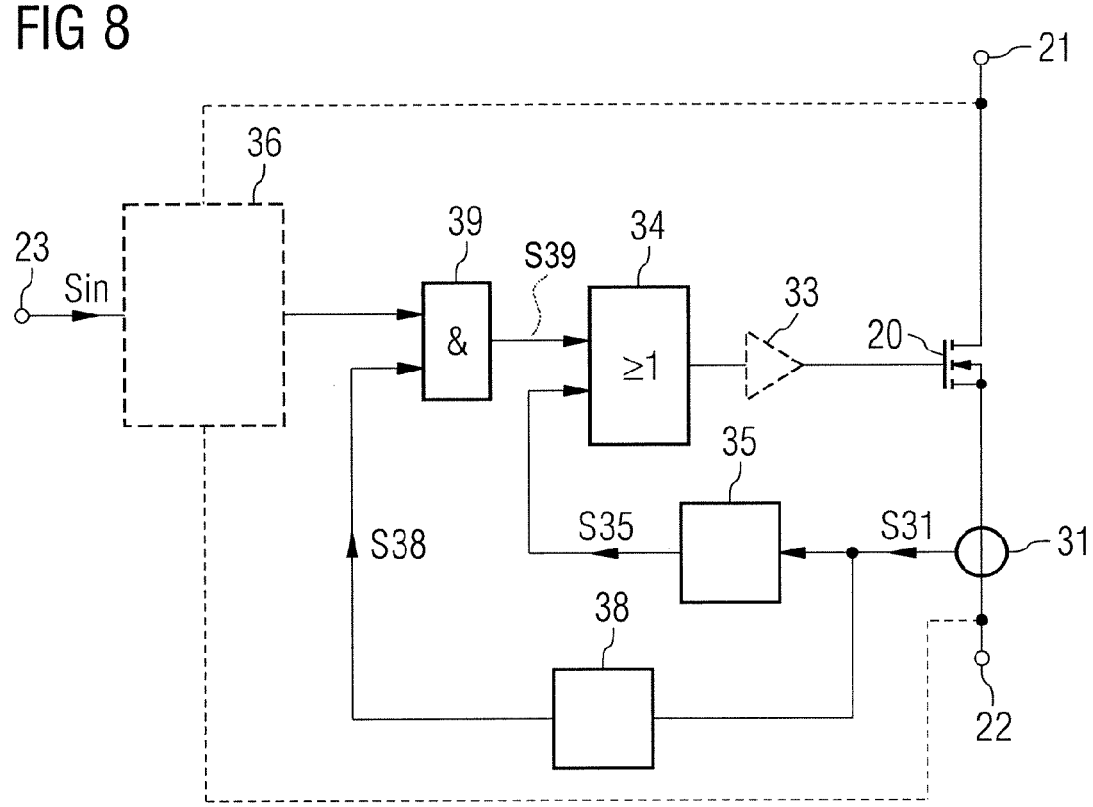
FIG. 8 shows an exemplary realization of a drive circuit for the semiconductor switch which permits the fuse function elucidated with reference to FIG. 7.

In this case, the maximum load current IZmax can be less than the maximum permissible turn-off current Imax, as is illustrated in FIG. 3a, but can also be greater than the maximum permissible turn-off current Imax, which is illustrated in FIG. 8 to be explained below.

Figure 4:
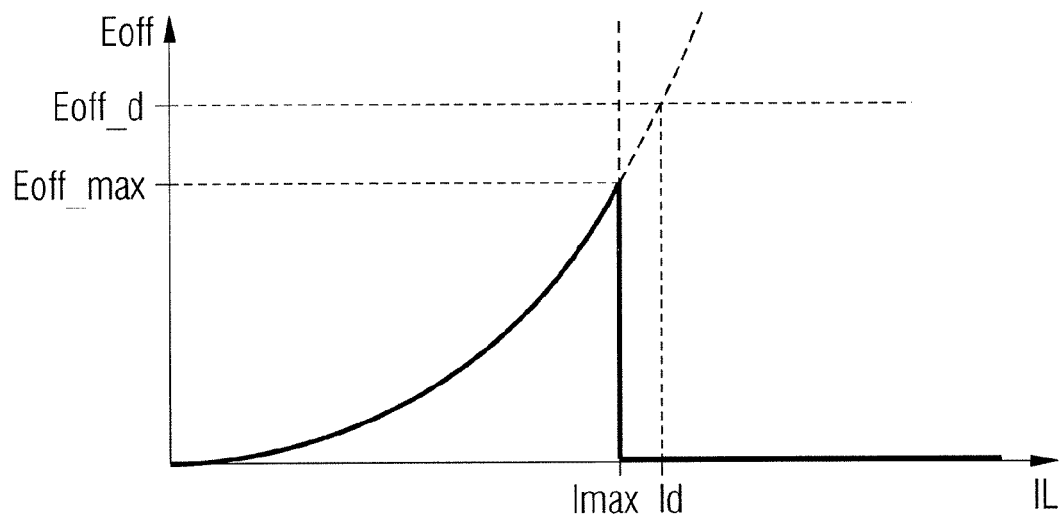
FIG. 4 illustrates an energy converted into heat in a semiconductor switch during the turn-off of an inductive load.

The maximum permissible turn-off current Imax can be adjustable by means of an adjusting signal Sadj, which can be able to be fed to the drive circuit 30 externally. This makes it possible to adapt the maximum permissible turn-off current Imax to the specific circuit environment in which the circuit arrangement comprising the fuse 1 and the switching arrangement 2 is used. Criteria for such an adaptation of the maximum permissible turn-off current Imax are explained below with reference to FIG. 4. FIG. 4 illustrates the turn-off energy Eoff converted into heat in the semiconductor switch 20 as a function of the load current IL for an inductive load connected to the circuit arrangement. The turn-off energy Eoff, referring to equations 1 and 2, rises approximately quadratically with the load current IL to be turned off and is dependent on the inductance of the load, wherein this inductance can also be governed by line inductances between the circuit arrangement and the load, or the location of a short circuit, itself or between the voltage source (V in FIG. 1) and the circuit arrangement. In FIG. 4, Eoff_d denotes a turn-off energy at which the transistor 20 would be destroyed, and Id denotes the assigned destruction current Id. In this case, the maximum permissible turn-off current Imax should be chosen in such a way that it is less than the destructive turn-off current Id, and this results in a maximum turn-off energy Eoff_max which is less than the destructive turn-off energy Eoff_d. If an inductance higher than that on which the curve in FIG. 4 is based is present, then the destructive turn-off energy Eoff_d is already attained at smaller load currents, and the destructive turn-off current Id is thus smaller, whereby the maximum permissible turn-off current Imax should be chosen to be correspondingly smaller.

The drive circuit 30 illustrated in FIG. 2 has a current measuring arrangement 31 for determining the load current IL, which arrangement generates a current measurement signal S31 that is dependent on the load current IL, and in particular proportional to the load current IL. The current measurement signal S31 is fed to a drive logic 32, to which the switching signal Sin is also fed and which generates the drive signal S30 for the transistor 20 from the current measurement signal S31 and the switching signal Sin.

Figure 5:
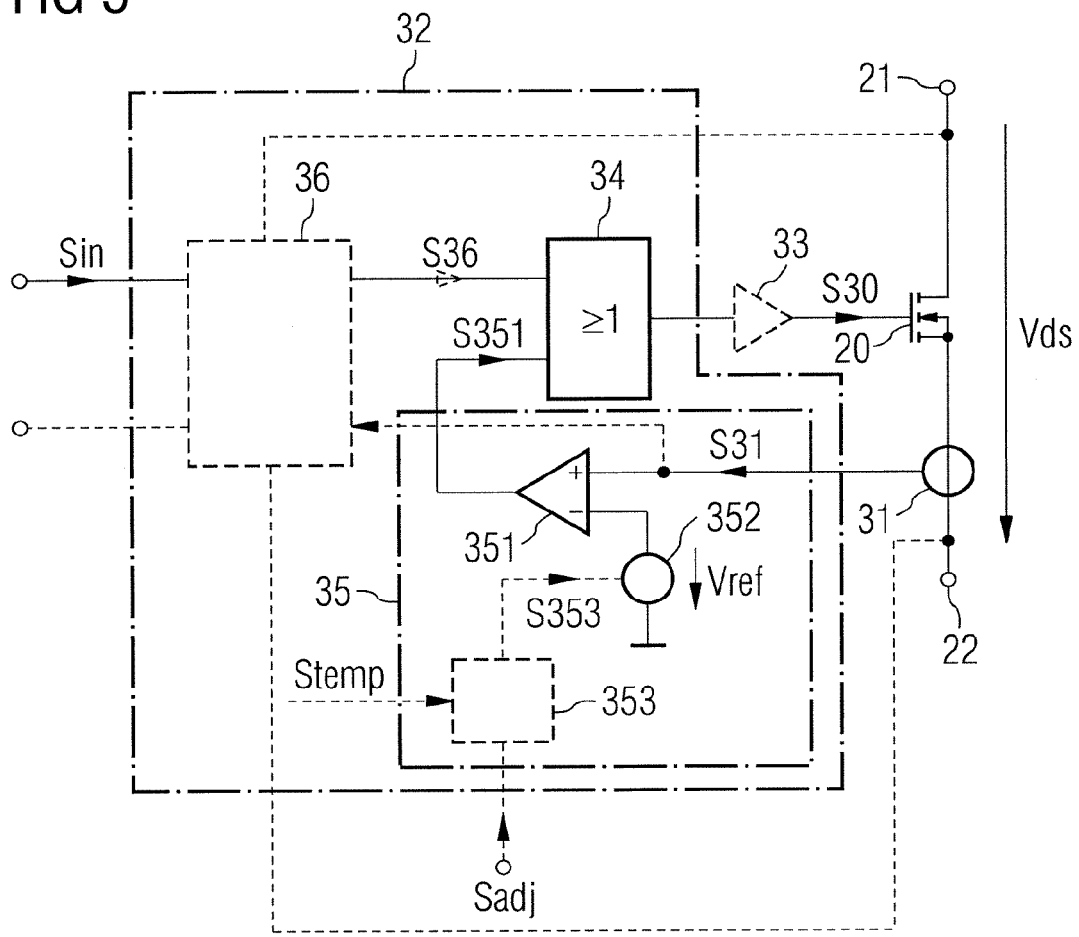
FIG. 5 shows an exemplary circuitry realization of a drive circuit which permits the function elucidated with reference to FIG. 3.

An exemplary circuitry realization of the drive logic 32 is illustrated in FIG. 5. This drive logic 32 has an evaluation circuit 35, to which the current measurement signal S31 is fed and which compares the current measurement signal S31 with a reference value Vref, which is provided by a reference voltage source 352 in the example. The reference value Vref represents the maximum permissible turn-off current or the current threshold value for the load current IL, starting from which the transistor 20 is intended to be prevented from being driven in the off state. In the comparator circuit 35 illustrated, the current measurement signal S31 and the reference value Vref are fed to a comparator 351, which provides a comparison signal S351 that is dependent on the comparison of the current measurement signal S31 with the reference value Vref. In the example illustrated, this comparator output signal assumes an upper signal level (high level) if the current measurement signal S31 exceeds the reference value Vref.

The comparison signal S351 is fed to a logic gate 34, at the output of which the drive signal S30 for the transistor 20 is available. In the example illustrated, the logic gate 34 is an OR gate, which holds the drive signal S30 at a drive level for as long as the comparison signal S351 assumes a high level, that is to say for as long as the current measurement signal S31 is greater than the reference value Vref. The switching signal Sin, for example, is fed to a second input of the OR gate 34. At a low level of the comparison signal S351, that is to say when the current measurement signal S31 is less than the reference value Vref, exclusively the switching signal Sin determines the switching state of the transistor 20.

Optionally, the switching signal Sin can be fed to a signal processing logic 36, which generates a modified switching signal S36, which is fed to the OR gate 34. The signal processing logic 36 can correspond to the drive logic of a conventional "intelligent MOSFET" (Smart-FET) and can realize, for example, further protection functions for the transistor 20. One such protection function is overtemperature protection, for example. In this case, the signal processing logic 36 generates, independently of the switching signal Sin, a switch-off level of the modified switching signal S36 if the temperature in the switching arrangement 2 exceeds a predetermined temperature threshold value. Independently of the modified switching signal S36, however, the transistor remains switched on if a high level of the comparison signal S351 signals an excessively high current. In other words, even upon the occurrence of an overtemperature, a turn-off of the semiconductor switch 20 is blocked, that is to say that the comparison signal S351 dominates the modified switching signal S36 in this case.

The overvoltage protection of the transistor 20 as already explained on the basis of an active zener circuit 51, 52 with reference to FIG. 2 could also be realized by the signal processing logic 36. For this purpose, the signal processing logic 36 measures the voltage drop across the load path D-S of the transistor 20 and generates, independently of the switching signal Sin, a switch-on level of the modified switching signal S36 if this voltage Vds exceeds a predetermined voltage threshold value. As a result of this, for example, a commutation of an inductive load is made possible by means of the transistor 20. The signal processing logic 36 could furthermore have a load detection function. In this case, a current flowing through the transistor 20 driven in the on state is used as a basis for determining whether a load is connected or whether an interruption of the load is present (open-load diagnosis). For this purpose, the current measurement signal S31 is fed to the signal processing logic 36. The signal processing logic 36 can furthermore have an interface toward the outside via which information about the load current currently flowing through the transistor 20 or information about possible fault states or the detected state of the load can be communicated, for example, to a microcontroller, which can generate the switching signal Sin.

For adjusting the maximum switching current Imax, the reference voltage source 352 is a controlled voltage source, for example, to which is fed the adjusting signal Sadj for adjusting the reference value Vref. The adjusting value fed to the reference voltage source 352 can furthermore be dependent on the temperature. It can thereby be ensured that at high ambient temperatures at which the transistor 20 can take up, without being destroyed, only a lower turn-off energy than at lower temperatures, the maximum permissible turn-off current Imax can be adjusted to lower values. For this purpose, the adjusting signal Sadj is fed to a temperature regulating circuit 353, for example, which adjusts the adjusting signal fed to the reference voltage source 352 depending on the external adjusting signal Sadj and a temperature signal Stemp. The temperature signal Stemp is provided, for example, by a temperature sensor (not illustrated). The temperature sensor can be the same temperature sensor which is used in the signal processing logic 36 for realizing over temperature protection.

Figure 6:
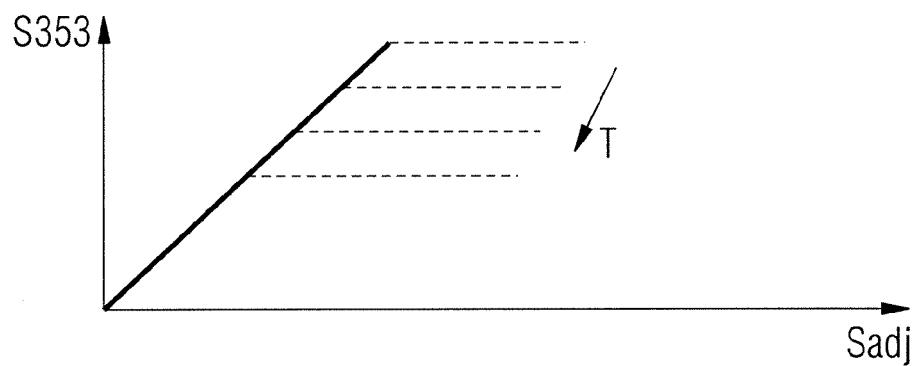
FIG. 6 illustrates the functioning of an adjusting circuit for adjusting a load current reference value.

Referring to FIG. 5, the temperature regulating circuit 353 can be realized, for example, in such way that it limits the adjusting signal S353 to an upper value depending on the temperature signal Stemp, wherein the value is all the lower, the higher the temperature. FIG. 6 shows the adjusting signal S353 fed to the reference voltage source 352 as a function of the externally fed adjusting signal Sadj, wherein the dashed signal profiles represent the limiting of the adjusting signal Sadj at rising temperatures T.

Figure 7:
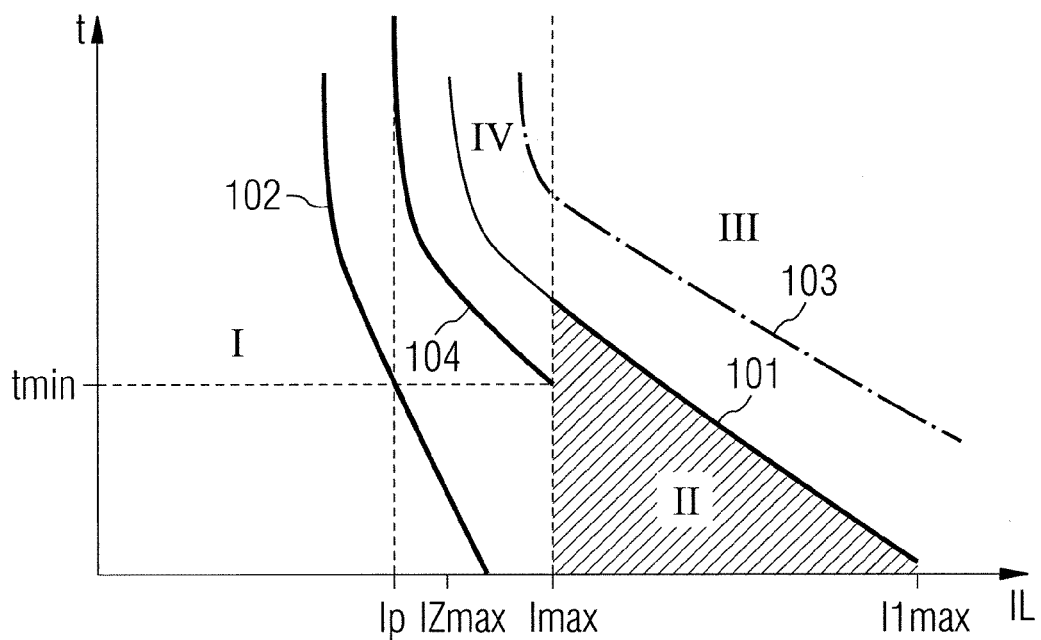
FIG. 7 illustrates the functioning of a further circuit arrangement, wherein the switching arrangement undertakes a fuse function, on the basis of load current characteristic curves.

FIG. 7 illustrates the functioning of a circuit arrangement modified relative to the circuit arrangement explained above, on the basis of load current characteristic curves. In this case, the switching arrangement 2 is designed to turn off the transistor 20 in accordance with a fuse characteristic curve implemented in the switching arrangement 2 for load currents that are smaller than the maximum permissible turn-off current Imax. The fuse characteristic curve is designated by the reference symbol 104 in FIG. 7 and represents turn-off states which are represented in each case by a load current and by a time duration for which the respective load current flows. The fuse characteristic curve is chosen in such a way that the transistor 20 is driven in the off state for currents less than the maximum permissible turn-off current Imax before the fuse actually triggers. The turn-off states represented by the fuse characteristic curve 104 are attained during proper operation of the switching arrangement 2 before the triggering states of the fuse 1 are actually attained. The fuse characteristic curve 104 of the switching arrangement 2 is implemented in such a way that the transistor 20 is turned off only after a delay time amounting to a minimum of tmin, where tmin in the example is the delay time if the load current IL corresponds to the maximum permissible turn-off current Imax or lies just below the maximum permissible turn-off current. Moreover, the "triggering delay" of the fuse function implemented by the semiconductor switch 20 is dependent on the load current flowing in each case, wherein the triggering delay is all the greater, the smaller the load current. For load currents smaller than a permanently permissible load current Ip, the fuse implemented by the transistor 20 does not trigger independently of the duration of the current flow of the load current IL.

The fuse characteristic curve 104 of the switching arrangement is chosen in relation to the load characteristic curve 102 in such a way that turn-off states of the transistor 20 are not attained during proper operation of the load.

Referring to FIG. 8, the fuse characteristic curve 104 of the switching arrangement 2 as explained with reference to FIG. 7 can be implemented by a fuse circuit 38, for example, to which the current measurement signal S31 is fed and which generates, depending on the current measurement signal S31, a turn-off signal S38 in accordance with the characteristic curve 104 explained above. The turn-off signal S38 is fed to an AND gate 39, for example, to the other input of which either the switching signal Sin or the modified switching signal S36 is fed and the output signal S39 of which is fed to the OR gate 34. Independently of the switching signal Sin or the modified switching signal S36, a turn-off level is available at the output of the AND gate 39 if the turn-off signal S38 assumes a turn-off level. The transistor 20 is then turned off via the OR gate 34. In this case, the fuse circuit 38 is implemented in such a way that a turn-off signal S38 can be generated only for those load currents IL which are smaller than the maximum permissible turn-off current Imax. This prevents conflicts to the effect that on the one hand, the transistor 20 is intended to be driven in the on state via the current evaluation circuit 35 and, on the other hand, the transistor 20 is intended to be driven in the off state via the fuse circuit 38.

The triggering characteristic curve illustrated in FIG. 7 is realized, for example, in such a way that for points which lie on the characteristic curve, the following relationship between the flowing current I and the time duration t for which the current flows holds true:

$$I^2 \cdot t = c \quad (3),$$

where c is a selectable constant and where I is less than Imax. Such a characteristic curve profile corresponds, for example, to the characteristic curve profile of a fusible link. In order to realize a turn-off behavior in accordance with such a characteristic curve, for example, a current measuring arrangement for detecting the current, a time measuring arrangement and a divider are necessary. In this case, the divider determines a triggering time $t_{TRG}$ in accordance with $$t_{TRG} = c/I_m^2 \quad (4),$$

where $I_m$ represents a load current determined by the current measuring arrangement. In this case, the time measuring arrangement measures the time duration for which the current $I_m$ flows, wherein the turn-off is effected if the time duration corresponds to the switch-off duration. Furthermore, there is the possibility of storing pairs of values comprising in each case a current value and a time value in a look-p table, wherein these pairs of values in each case represent a point on the triggering characteristic curve. The current and the time for which the current flows are measured in the case of this procedure, too. A turn-off is effected when the current and the time correspond to a pair of values stored in the look-up table.

In order to attain the characteristic curve behavior explained, there is alternatively the possibility, for currents which are smaller than Imax, of integrating the square of the current and then effecting turn-off if this integral reaches the predetermined value c. In other words, the turn-off condition is attained in each case when the following holds true:

$$\int I^2 dt = c \quad (5).$$

In a further alternative for realizing such a characteristic curve behavior, provision is made for evaluating the temperature in the semiconductor chip which contains the semiconductor switch 20. In this case, use is made of the fact that the temperature in the semiconductor body is dependent on a power loss converted into heat in the semiconductor switch and is thus dependent on the current flowing through the semiconductor body. Changes in the current thus lead to changes in the temperature in the semiconductor chip. In this case, the temperature rises in the semiconductor body firstly in those (active) regions of the semiconductor chip in which the semiconductor switch is integrated. For currents which only flow for a short time, for example, a few 10 to a few 100 milliseconds, the heat dissipation in the semiconductor body can be disregarded. A current change thereby directly affects the temperature change in the vicinity of the semiconductor chip, that is to say that the following holds true:

$$\Delta I^2 \cdot t \approx c2 \cdot \Delta T \quad (6).$$

The square of the current change over time is therefore at least approximately proportional to the temperature change (c2 is a constant representing the proportionality factor). The temperature change is therefore directly a measure of an energy additionally converted in the semiconductor body as a result of a current change.

In order to measure the temperature change, in one variant, two temperature sensors are provided, to be precise a first sensor in direct proximity to the semiconductor switch in the semiconductor chip and a second sensor. In this case, the second sensor is arranged in a manner spaced apart so far from the first sensor that a temperature change in the region of the first sensor within the short time durations of interest does not affect the temperature in the region of the second sensor. A difference between the temperatures determined by the first and second sensors then corresponds to the temperature change ΔT. The semiconductor switch 20 is turned off when this temperature difference is greater than a predetermined threshold value.

In a second variant, only one sensor is provided, which detects the temperature in each case at predetermined time intervals. If the temperature change between two successive measurement instances is in this case greater than a predetermined threshold value, then the semiconductor switch 20 is turned off.

Figure 9:
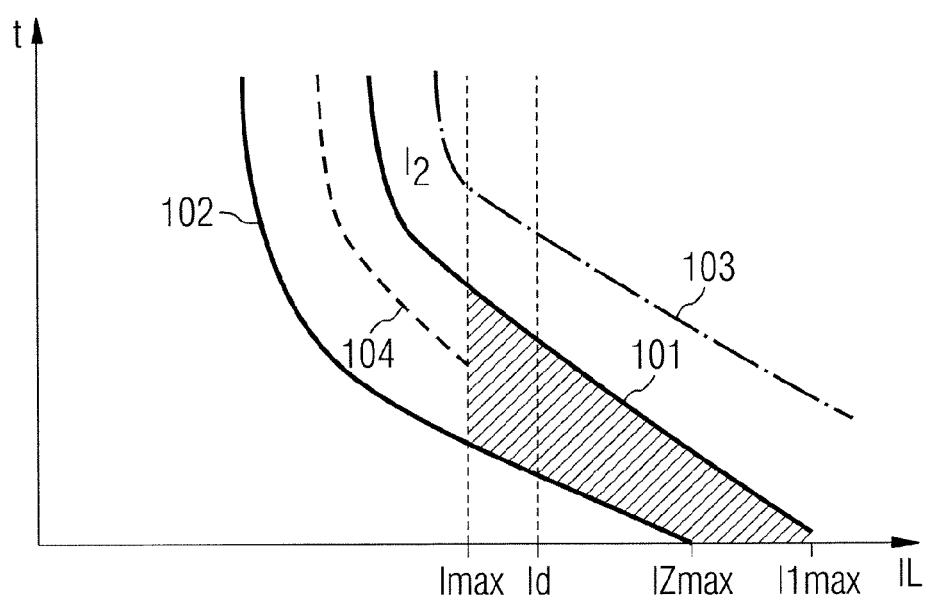
FIG. 9 illustrates the functioning of a further circuit arrangement on the basis of load current characteristic curves.

Referring to FIG. 9, the maximum permissible turn-off current Imax can be chosen in such a way that it is less than the maximum load current IZmax which is predetermined by the load characteristic curve 102 and which flows during proper operation. However, the maximum triggering current I1max of the fuse is greater than the maximum load current IZmax. A fuse function of the switching arrangement 2 with the fuse characteristic curve 104 explained above with reference to FIG. 7 can be implemented irrespective of whether the maximum load current IZmax is greater or less than the maximum permissible turn-off current Imax.

Figure 10:
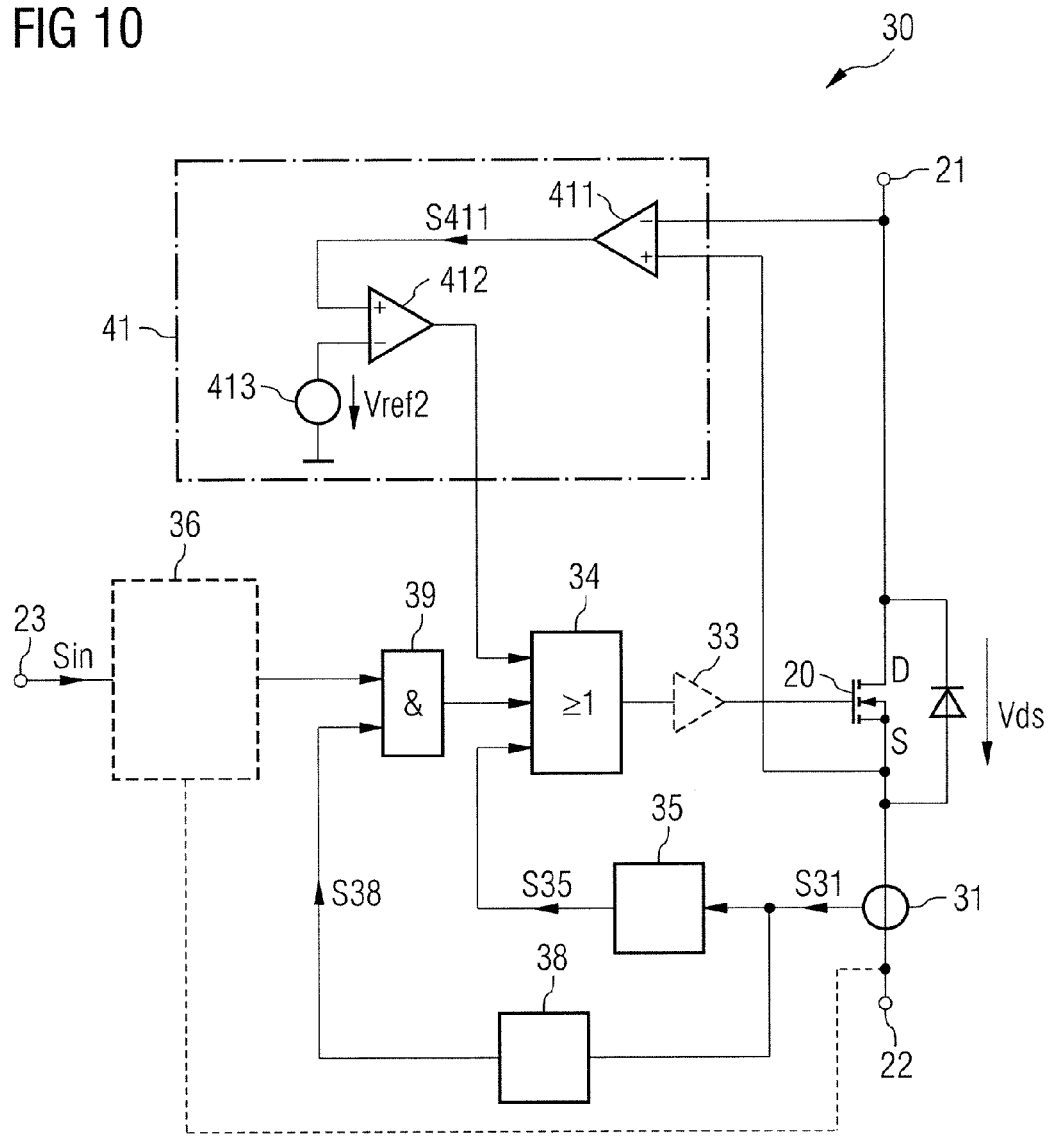
FIG. 10 shows an exemplary realization of a drive circuit which permits the semiconductor switch to be driven in the on state in the event of the semiconductor switch being reverse-biased.

FIG. 10 shows a further modification of the above-explained drive circuit 30 for the transistor 20. In this case, the drive logic is designed to drive the semiconductor switch 20 in the on state if the semiconductor switch 20 is operated in the reverse direction and the magnitude of a voltage drop Vds across the drain-source path D-S in this case exceeds a predetermined threshold value. Such a drive logic can be used, in particular, when a MOSFET is used as a semiconductor switch. MOSFETs have an integrated body diode whose forward direction runs in the source-drain direction in the case of an n-channel MOSFET. The integrated body diode is explicitly illustrated for the MOSFET 20 illustrated in FIG. 10. If the circuit arrangement comprising the fuse 1 and the switching arrangement 2 is connected with polarity reversed, such that the source connection of the MOSFET 20 faces the positive connection of the voltage source, then a current flows directly through the MOSFET 20 after the electric circuit has been closed by connecting the load and/or the voltage source. In contrast to this, a current flows through the MOSFET, in accordance with the previous explanations, in a forward direction only when the MOSFET is driven in the on state. When the MOSFET is operated in the reverse direction, the circuit arrangement can no longer perform a switching function. However, since the on resistance of the body diode driven in the on state is higher than the on resistance when the MOSFET is driven in the on state, an overheating of the MOSFET and hence destruction can occur during this operating state. In order to avoid this, provision is made for detecting the voltage drop in the reverse direction, that is to say in the source-drain direction of the MOSFET 20, comparing the voltage drop with a reference value, and driving the MOSFET 20 in the on state if the voltage drop exceeds the predetermined reference value, that is to say if operation of the MOSFET 20 in the reverse direction can be assumed.

For this purpose, the drive logic illustrated in FIG. 10 has a second evaluation circuit 41, which determines the voltage drop in the reverse direction by means of a differential amplifier 411 and feeds a voltage measurement signal S411 determined thereby to a comparator 412, which compares the voltage measurement signal S411 with a reference voltage Vref2 generated by a second reference voltage source 413. In the example illustrated, an output signal S412 of the comparator is fed to the OR gate 34, which drives the MOSFET 20 in the on state independently of the further signals fed to the OR gate, as soon as the voltage drop in the reverse direction exceeds a threshold value represented by the reference value Vref.

Apart from in the case of polarity reversal of the circuit arrangement, a current flow in the reverse direction can also occur during the switching of inductive loads.

Figure 11:
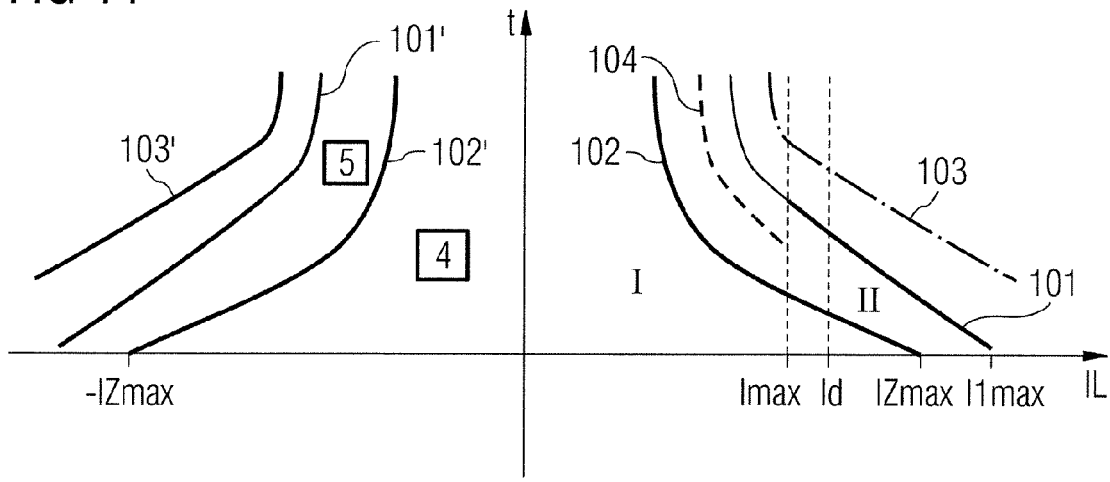
FIG. 11 illustrates the functioning of a circuit arrangement having a switching arrangement in accordance with FIG. 10, on the basis of load current characteristic curves.

A fuse function of the circuit arrangement is ensured by the fuse 1 during reverse operation of the MOSFET 20. Referring to FIG. 11, the fuse has the same triggering characteristic curve independently of the current direction of the current flowing through the fuse. In FIG. 11, which illustrates the characteristic curves of the circuit arrangement that have already been explained above, the triggering characteristic curve of the fuse for negative load currents -IL is likewise illustrated and designated by the reference symbol 101'. FIG. 11 also illustrates the load characteristic curve for negative load currents, which is designated by the reference symbol 102' and which corresponds to the load characteristic curve 102 for positive load currents in the example illustrated. With 103', FIG. 11 illustrates the destruction characteristic curve for negative load currents -IL.

For elucidating the functioning of the drive circuit 30, the figures explained above show exemplary realizations of the drive circuit 30 which are realized using analog circuit components. It should be pointed out in this context that the analog components can, of course, be replaced by identically acting digital components in order to achieve the same function.

Figure 12:
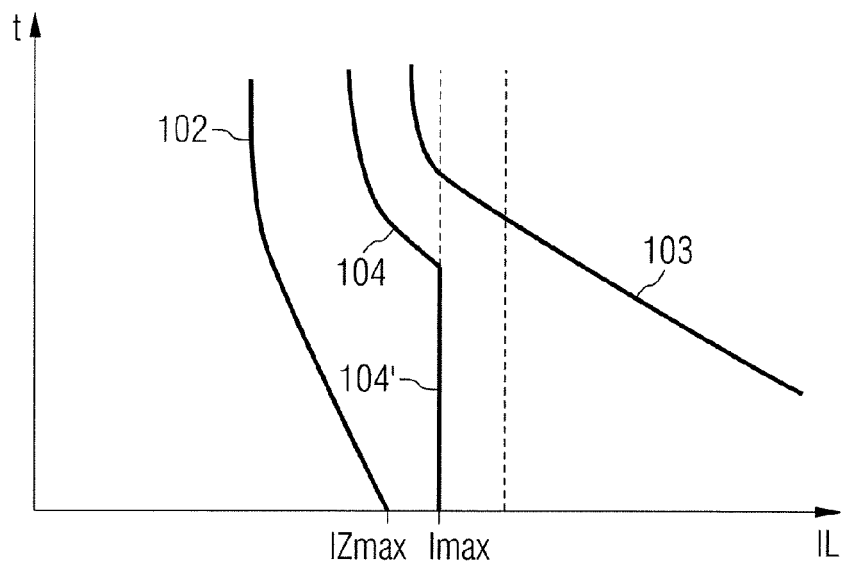
FIG. 12 illustrates the functioning of a further circuit arrangement on the basis of load current characteristic curves.

FIG. 12 shows the family of characteristic curves of a modified circuit arrangement wherein the switching arrangement is realized in such a way that it turns off when the maximum permissible turn-off current Imax is reached. This results in a fuse characteristic curve 104' having two characteristic curve sections, a first characteristic curve section, for load currents IL less than the maximum turn-off current Imax. This characteristic curve section corresponds to the fuse characteristic curve 104 already explained above. A second characteristic curve section results for shorter turn-off delays by virtue of the fact that the transistor 20 is driven in the off state as soon as the load current IL reaches the maximum permissible turn-off current Imax. In the case of a circuit arrangement implemented in this way, it is possible to dispense with a fuse in series with the switching arrangement 2. In this case, the circuit arrangement only comprises a switching arrangement having the characteristic curve behavior explained with reference to FIG. 12.

What is claimed is:

1. A circuit comprising:
   a drive circuit comprising
      an output terminal configured to be coupled to a control terminal of a semiconductor switch having a load path coupled in series with a fuse,
      an input terminal for requesting an on state and an off state of the semiconductor switch, and
      a current measuring arrangement for determining a load current flowing through the load path, wherein the drive circuit is configured to prevent the semiconductor switch from being driven in the off state if the load current exceeds a first load current threshold.

2. The circuit as claimed in claim 1, wherein the first load current threshold value is less than a maximum triggering current at which the fuse triggers with a minimum triggering delay.

3. The circuit as claimed in claim 2, wherein the first load current threshold value is greater than a continuous loading current of the fuse.

4. The circuit as claimed in claim 1, wherein the drive circuit is designed to drive the semiconductor switch in the off state after a delay time if the load current is less than the first load current threshold value and greater than a second load current threshold value.

5. The circuit as claimed in claim 4, wherein the delay time is dependent on the load current.

6. The circuit as claimed in claim 5, wherein the delay time increases as the load current decreases.

7. The circuit as claimed in claim 1, wherein the first load current threshold value is dependent on a temperature in the drive circuit.

8. The circuit as claimed in claim 7, wherein the first load current threshold value decreases as the temperature rises.

9. The circuit as claimed in claim 1, wherein the first load current threshold value is dependent on a temperature in the semiconductor switch.

10. The circuit as claimed in claim 9, wherein the first load current threshold value decreases as the temperature rises.

11. The circuit as claimed in claim 1, wherein the first load current threshold value can be adjusted via an input connection of the drive circuit.

12. The circuit as claimed in claim 1, wherein the semiconductor switch is a MOSFET with an integrated body diode and wherein the drive circuit is designed to drive the semiconductor switch in the off state if the body diode is forward-biased and if a voltage drop across the body diode exceeds a predetermined voltage threshold value.

13. The circuit as claimed in claim 4, wherein the second load current threshold value comprises a permanently permissible load current of the fuse.

14. The circuit as claimed in claim 1, further comprising the fuse.

15. The circuit as claimed in claim 1, further comprising the semiconductor switch.

16. A circuit comprising:
    a switch comprising a control terminal and a current path, the current path configured to be coupled in series with a fuse;
    a current measuring circuit coupled in series with the current path of the switch, the current measuring circuit configured to measure a load current; and
    drive logic circuitry having a first input coupled to a switching signal node, a second input coupled to a current measurement signal output of the current measuring circuit and an output coupled to the control terminal of the switch, wherein the drive logic circuitry output prevents the switch from being driven in an off state if the load current is greater than a current threshold.

17. The circuit as claimed in claim 16, wherein the switch comprises a field effect transistor, wherein the control terminal comprises a gate of the field effect transistor and the current path is between a source and a drain of the field effect transistor.

18. The circuit as claimed in claim 17, wherein the current measuring circuit includes a current path terminal coupled to the source of the field effect transistor and wherein the fuse includes a terminal coupled to the drain of the field effect transistor.

19. The circuit as claimed in claim 17, further comprising a diode pair coupled between the gate of the field effect transistor and the drain of the field effect transistor.

20. The circuit as claimed in claim 16, wherein the drive logic circuitry further includes an adjusting signal input for adjusting the current threshold.

21. The circuit as claimed in claim 16, further comprising the fuse.

22. A method of switching an electrical signal, the method comprising:
   determining a load current flowing through a load path of a semiconductor switch, wherein the semiconductor switch is prevented from being driven in an off state if the load current exceeds a predetermined load current threshold value; and
   preventing the load current from flowing based upon a condition dependent at least on the load current present.

23. The method as claimed in claim 22, wherein preventing the load current from flowing comprises triggering a fuse that is arranged in series with the load path.

\* \* \* \* \*